(12) United States Patent
Jang et al.

(10) Patent No.: US 6,197,660 B1
(45) Date of Patent: Mar. 6, 2001

(54) INTEGRATION OF CMP AND WET OR DRY ETCHING FOR STI

(75) Inventors: Syun-Ming Jang, Hsin-Chu; Ying-Ho Chen, Taipei, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/301,223

(22) Filed: Apr. 29, 1999

(51) Int. Cl.[7] .................... H01L 21/76; H01L 21/302; H01L 21/461
(52) U.S. Cl. .................. 438/427; 438/424; 438/437; 438/692; 438/693
(58) Field of Search .................... 438/427, 437, 438/692, 699, 633, 763, 702, 424, 693

(56) References Cited

U.S. PATENT DOCUMENTS

| | | | |
|---|---|---|---|
| 5,175,122 | 12/1992 | Wang et al. | 437/67 |
| 5,494,854 | 2/1996 | Jain | 437/195 |
| 5,498,565 | * 3/1996 | Gocho et al. | |
| 5,621,241 | 4/1997 | Jain | 257/632 |
| 5,663,107 | 9/1997 | Peschke et al. | 438/692 |
| 5,665,202 | * 9/1997 | Subramanian et al. | |
| 5,721,173 | 2/1998 | Yano et al. | 438/424 |
| 5,817,567 | * 10/1998 | Jang et al. | |
| 5,872,043 | * 2/1999 | Chen | |
| 6,037,237 | * 3/2000 | Park et al. | |
| 6,048,775 | * 4/2000 | Yao et al. | |
| 6,136,713 | * 10/2000 | Chen et al. | |

* cited by examiner

Primary Examiner—John F. Niebling
Assistant Examiner—Ron Pompey
(74) Attorney, Agent, or Firm—George O. Saile; Stephen B. Ackerman

(57) ABSTRACT

Shallow trench isolation in which trenches having varying dimensions have been formed in a hard surface such as silicon nitride can lead to dishing inside the larger trenches. To overcome this, the trenches were first over-filled with a layer of HDPCVD oxide followed by the deposition of a relatively soft dielectric layer, using a conformal deposition method. CMP was then used to remove both the added layer and most of the original HDPCVD oxide, a small thickness of the latter being left in place. Because of the earlier influence of the added layer the resulting surface was planar and a conventional wet or dry etch could be used to remove the remaining oxide, thereby exposing the top surface and fully filling the trenches without any dishing.

20 Claims, 2 Drawing Sheets

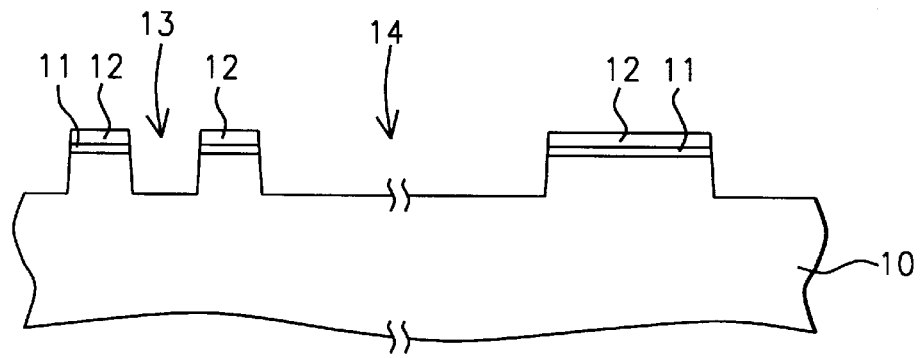
FIG. 1 – Prior Art
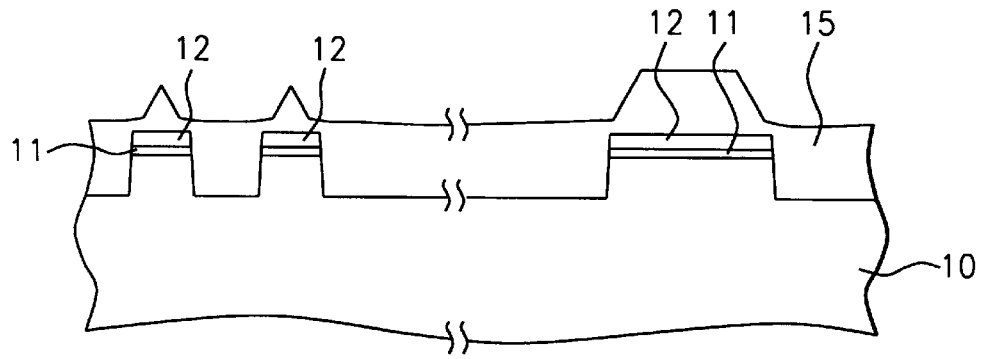
FIG. 2 – Prior Art
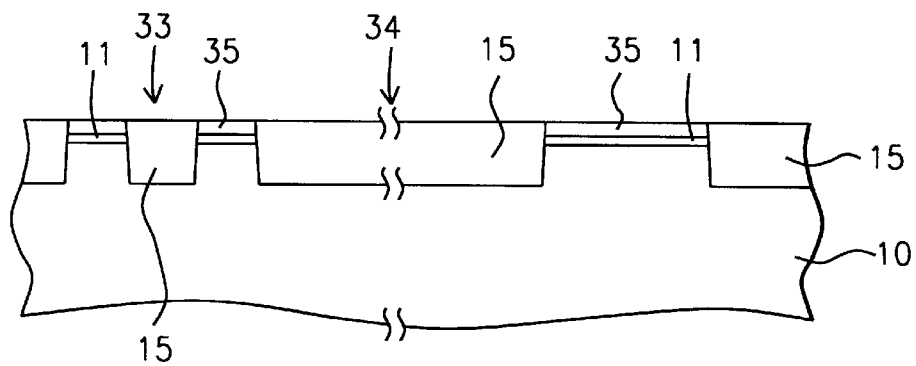
FIG. 3 – Prior Art

INTEGRATION OF CMP AND WET OR DRY ETCHING FOR STI

FIELD OF THE INVENTION

The invention relates to the general field of integrated circuits with particular reference to shallow trench isolation and methods for filling said trenches.

BACKGROUND OF THE INVENTION

As the devices used in integrated circuits continue to shrink in size, the method of shallow trench isolation (STI) has been widely used in preference to the earlier method known as local oxidation of silicon (LOCOS). In practice, the dimensions of trenches that are to be filled can vary significantly. In particular, it is possible that some of the trenches may have very small widths, as low as about 3,000 Angstroms. Special deposition methods need to be used to fill such narrow trenches. An example of this is the method known as HDPCVD. (High density plasma chemical vapor deposition) wherein conventional CVD is combined with bias sputtering. In this manner, atoms or molecules that are not tightly bound are re-sputtered before they get incorporated into the growing film. The result is a very dense material comparable, in the case of deposited oxide, to an oxide layer grown by thermal oxidation.

In practice, it is always necessary to over-fill the trenches and to then etch back until the trenches have just been filled. This is not of itself a problem unless the surface between the trenches has been coated with a hard material such as, for example, silicon nitride. FIG. 1 shows an example of such a situation. Silicon body 10 has an upper surface of silicon nitride 12 (underlaid by a thin layer of pad oxide for the purpose of stress reduction). Trenches 13 and 14 of different sizes have been etched into the surface of 10. FIG. 2 shows the result of covering silicon body 10 with a layer of HDPCVD oxide. All trenches have been over-filled so that there is an excess amount of layer 15 above the the silicon nitride.

The practice of the prior art would now be to use CMP to planarize the surface. Because of the hardness of the material directly above the silicon nitride as compared to material over the trenches, the appearance of the structure after CMP is as shown in FIG. 3. As can be seen, considerable dishing 34 has occurred over the wider trench. Little or no dishing has occurred over the narrower trench 33 because the advance of the etch front will be dominated by the silicon nitride surface on each side. Thus, the problem which the present invention seeks to solve is how to combine the HDPCVD deposition method with the CMP material removal method.

In our search for prior art we came across a number of references to HDPCVD oxide, to CMP, and to etch-back but none of these describe the process of the present invention. Several of these references were of interest, however. For example Jain in two patents of a divisional (U.S. Pat. No. 5,494,854 February 1996 and U.S. Pat. No. 5,621,241 April 1997) describes using HDPCVD together with CMP in connection with planarizing dielectric deposited over metal wiring. Yano et al. (U.S. Pat. No. 5,721,173 February 1998) shows methods of planarizing shallow trenches by means of a selective etch back process. Wang et al. (U.S. Pat. No. 5,175,122 December 1992) show a process involving planarization and etch back as do Peschke et al. (U.S. Pat. No. 5,663,107 September 1997).

SUMMARY OF THE INVENTION

It has been an object of the present invention to provide a process for shallow trench isolation in the absence of dishing.

Another object of the invention has been that said process be effective for trenches formed in the presence of a hard surface such as silicon nitride, said trenches having a wide variation in their dimensions.

A still further object of the invention has been to integrate high density plasma CVD with CMP during trench filling.

These objects have been achieved by first over-filling trenches with a layer of HDPCVD oxide followed by the deposition of a relatively soft dielectric layer using a conformal deposition method. CMP is then used to remove both the added layer and most of the original HDPCVD oxide, a small thickness of the latter being left in place. Because of the earlier influence of the added layer the resulting surface is planar and a conventional wet or dry etch may be used to remove the remaining oxide, thereby exposing the top hard surface and filling the trenches without any dishing.

BRIEF DESCRIPTION OF THE DRAWINGS

FIG. 1 is a schematic cross-section of a silicon body such as might form an integrated circuit into whose surface shallow trenches have been etched.

FIG. 2 shows the structure of FIG. 1 after the trenches have been over-filled with a layer of material having good filling characteristics such as HDPCVD oxide.

FIG. 3 shows the result of attempting to remove excessive material from the trenches by means of CMP.

DESCRIPTION OF THE PREFERRED EMBODIMENTS

The process of the present invention begins with the structure shown in FIG. 2 where trench filling layer 15 of HDPCVD oxide has been deposited over the surface of silicon body 10 so as to over-fill trenches such as 13 and 14 (see FIG. 1). The possible dimensions of such trenches cover a wide range. They may be anywhere between about 0.25 and 5,000 microns in width and anywhere between about 0.25 and 5,000 microns in length. The depths of such trenches could also be in the range of between about 5,000 and 7,000 Angstroms.

The details of the HDPCVD process that we used are as follows:

Silane as the silicon source, oxygen as the oxidizing agent, and argon as the sputtering gas. A deposition-:sputter rate ratio between about 4:1 and 8:1. Reactor chamber pressure between about 9 and 13 mtorr. An RF frequency of 2 MHz at a power level between about 2,000 and 5,000 watts. Silane flow rate between about 30 and 50 SCCM. Argon flow rate between about 10 and 20 SCCM Layer 15 of HDPCVD was deposited to a thickness between about 6,000 and 8,000 Angstroms.

Figure 4:
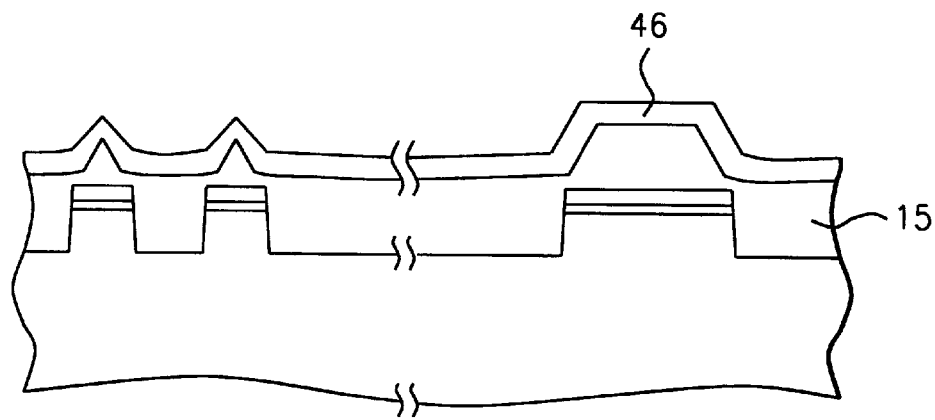
FIG. 4 shows the deposition of a layer of relatively soft material over the surface seen in FIG. 2.

FIG. 4 illustrates a key feature of the invention. Using a conformal coating method layer 46 was deposited over layer 15. The deposition method used to lay down said conformal coating was plasma enhanced CVD (PECVD) or spin on glass (SOG) by spin coating. Our preferred material for layer 46 has been PE-TEOS (plasma enhanced tetra-ethyl-orthosilicate) but other materials such as PE silane oxide or SOG could also have been used. Layer 46 was deposited to a thickness between about 1,000 and 3,000 Angstroms.

Figure 5:
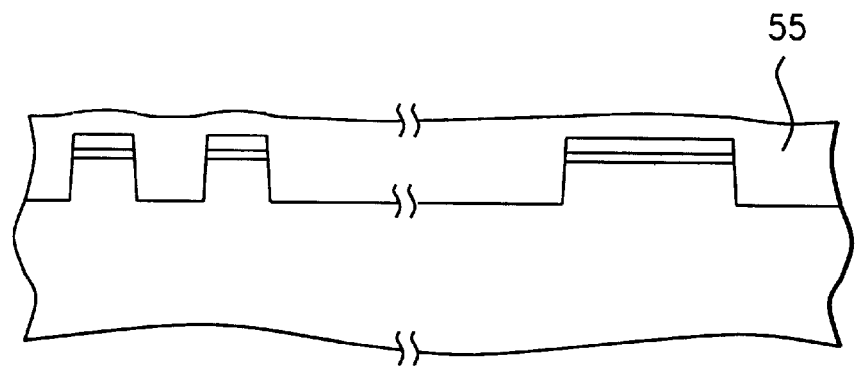
FIG. 5 shows the result of moving material from this structure by means of CMP, care having been taken to leave some material behind.

With layer 46 in place, it was now possible to proceed with CMP in the usual way. The presence of layer 46 allowed etching to proceed evenly across the entire surface but CMP was terminated before the silicon nitride surface of 10 was reached. The remaining amount of the original layer 15 (shown as layer 55 in FIG. 5) had a thickness (Including the trench depth) between about 4,500 and 5,500 Angstroms. The thickness of layer 55 above the silicon nitride was between about 100 and 1,000 Angstroms.

Removal of the remaining amount of layer 55 (above the trenches) was effected using either a wet or a dry etch. For the wet etch we used 50:1 HF while for the dry etch we used a mixture of $CO/C_4F_8/Ar$ gases.

Figure 6:
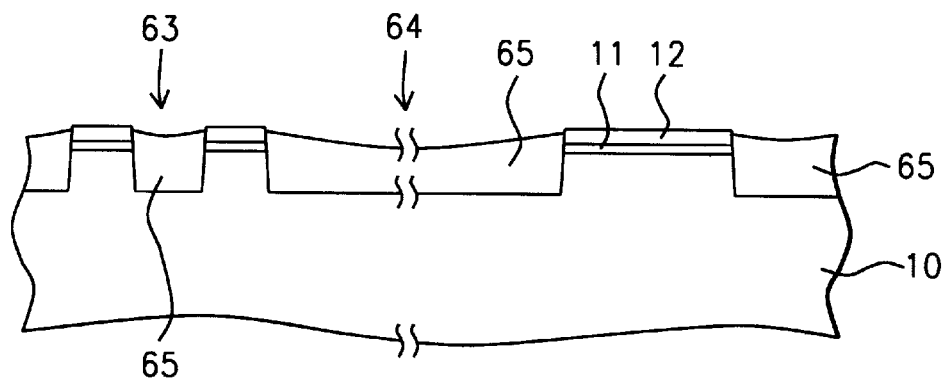
FIG. 6 shows the final outcome of the process of the present invention which is a uniform filling of the trenches without any dishing.

Provided the above described procedure was followed, the result is as illustrated in FIG. 6. Trenches 63 and 64 are seen to have been uniformly filled to be level with the surface of layer 12, despite the vast differences in their widths. The following data confirms the effectiveness of the process:

TABLE I

| Oxide thickness on Cell # | Oxide remaining on OD pad 100 × 1,000µ | Oxide thickness in trench area ~3,500 × 4,000µ | Oxide remaining on OD pad 1,000 × 1,000µ | Thickness of the PE-TEOS layer (Å) |
|---|---|---|---|---|
| 4451 | 0 | 4102 | 739–1330 | 0 |
| 5070 | <65 | 4700 | 883–1172 | 2,000 |
| 5225 | <130 | 4850 | 807–1020 | 4,000 |

TABLE I shows that substantial increases in the PE-TEOS thickness caused only small changes in the amount of oxide on the pad or in the trench. This means that the CMP margin can be improved, eliminating the need to over-polish in order to be sure that all oxide is cleared out of the pad.

While the invention has been particularly shown and described with reference to the preferred embodiments thereof, it will be understood by those skilled in the art that various changes in form and details may be made without departing from the spirit and scope of the invention.

What is claimed is:

1. A process for filling a shallow trench in an integrated circuit, comprising the sequential steps of:
   providing a silicon body having an upper surface on which there is a layer of silicon nitride and from which a plurality of shallow trenches of varying lengths, widths, and depths extend downward's into said silicon body;
   by means of HDPCVD, depositing a layer of silicon oxide onto said surface and into said trenches whereby the trenches are over-filled;
   by means of a conformal coating method, depositing a layer of a dielectric on said layer of silicon oxide;
   by means of CMP, removing said dielectric layer and a portion of the silicon oxide whereby all of said upper surface remains coated by an amount of silicon oxide having a thickness; and
   using a wet etch, removing an additional amount of the silicon oxide whereby the silicon nitride is fully exposed and said trenches are fully filled.

2. The process of claim 1 wherein the trenches have widths between about 0.25 and 5,000 microns and lengths between about 0.25 and 5,000 microns.

3. The process of claim 1 wherein the trenches have depths between about 5,000 and 7,000 Angstroms.

4. The process of claim 1 wherein the step of using HDPCVD further comprises:
   using silane as the silicon source, oxygen as the oxidizing agent, and argon as the sputtering gas;
   adjusting for a deposition:sputter rate ratio between about 4:1 and 8:1;
   using a reactor chamber pressure between about 9 and 13 mtorr, with an RF frequency of 2 MHz at a power level between about 2,000 and 5,000 watts;
   providing a silane flow rate between about 30 and 50 SCCM; and
   an argon flow rate between about 10 and 20 SCCM.

5. The process of claim 1 wherein the layer of HDPCVD oxide is deposited to a thickness between about 6,000 and 8,000 microns.

6. The process of claim 1 wherein said conformal coating method further comprises plasma enhanced TEOS or plasma enhanced chemical vapor deposition or spin on glass coating.

7. The process of claim 1 wherein the dielectric is PE silane oxide or SOG.

8. The process of claim 1 wherein said dielectric layer is deposited to a thickness between about 1,000 and 3,000 Angstroms and is softer than the silicon oxide.

9. The process of claim 1 wherein the thickness of silicon oxide remaining after CMP is between about 4,500 and 5,500 Angstroms.

10. The process of claim 1 wherein said wet etch further comprises using 50:1 HF.

11. A process for filling a shallow trench in an integrated circuit, comprising sequential steps of:
    providing a silicon body having an upper surface on which there is a layer of silicon nitride and from which a plurality of shallow trenches of varying lengths, widths, and depths extend downward's into said silicon body;
    by means of HDPCVD, depositing a layer of silicon oxide onto said surface and into said trenches whereby the trenches are over-filled;
    by means of conformal coating method, depositing a layer of a dielectric on said layer of silicon oxide;
    by means of CMP, removing said dielectric layer and a portion of the silicon oxide whereby all of said upper surface remains coated by an amount of silicon oxide having a thickness; and
    using a dry etch, removing an additional amount of the silicon oxide whereby the silicon nitride is fully exposed and said trenches are fully filled.

12. The process of claim 11 wherein the trenches have widths between about 0.25 and 5,000 microns and lengths between about 0.25 and 5,000 microns.

13. The process of claim 11 wherein the trenches have depths between about 5,000 and 7,000 Angstroms.

14. The process of claim 11 wherein using HDPCVD further comprises:
  using silane as the silicon source, oxygen as the oxidizing agent, and argon as the sputtering gas;
  adjusting for a deposition:sputter rate ratio between about 4:1 and 8:1;
  using a reactor chamber pressure between about 9 and 13 mtorr, with an RF frequency of 2 MHz at a power level between about 2,000 and 5,000 watts;
  providing a silane flow rate between about 30 and 50 SCCM; and
  an argon flow rate between about 10 and 20 SCCM.

15. Process of claim 11 wherein the layer of HDPCVD oxide is deposited to a thickness between about 6,000 and 8,000 microns.

16. The process of claim 11 wherein said conformal coating method further comprises plasma enhanced TEOS or plasma enhanced chemical vapor deposition or spin on glass coating.

17. The process of claim 11 wherein the dielectric is PE silane oxide or SOG.

18. The process of claim 11 wherein said dielectric layer is deposited to a thickness between about 1,000 and 3,000 Angstroms and is softer than the silicon oxide.

19. The process of claim 11 wherein the thickness of silicon oxide remaining after CMP is between about 4,500 and 5,500 Angstroms.

20. The process of claim 11 wherein said dry etch further comprises using a mixture of $CO/C_4F_8/Ar$ gases.

* * * * *